United States Patent [19]

Kabeshita et al.

[11] Patent Number: 4,829,665
[45] Date of Patent: May 16, 1989

[54] METHOD AND APPARATUS FOR MOUNTING ELECTRONIC COMPONENTS

[75] Inventors: Akira Kabeshita; Tokuhito Hamane, both of Hirakata; Souhei Tanaka, Neyagawa, all of Japan

[73] Assignee: Matsushita Electric Industrial Co., Ltd., Kadoma, Japan

[21] Appl. No.: 127,030

[22] Filed: Nov. 30, 1987

[30] Foreign Application Priority Data

Dec. 1, 1986 [JP] Japan .................. 61-286332
Dec. 11, 1986 [JP] Japan .................. 61-295258
Dec. 11, 1986 [JP] Japan .................. 61-295259

[51] Int. Cl.⁴ .............................. H05K 3/30
[52] U.S. Cl. ...................... 29/840; 29/740; 29/759
[58] Field of Search ............ 29/740, 741, 739, 759, 29/840, 835, 841, 832

[56] References Cited

U.S. PATENT DOCUMENTS

| | | | |
|---|---|---|---|
| 3,710,479 | 1/1973 | Bernardo et al. | 29/741 |
| 3,963,456 | 6/1976 | Tsuchiya et al. | 29/739 |
| 4,451,324 | 5/1984 | Ichikawa et al. | 29/740 X |
| 4,474,639 | 10/1984 | Fritz | 29/740 X |

*Primary Examiner*—Carl E. Hall
*Attorney, Agent, or Firm*—Cushman, Darby & Cushman

[57] ABSTRACT

In mounting electronic components (1) from an electronic components pack (5) to a substrate (10), the substrate (10) is put on a table movable horizontally in X-Y directions, and the electronic components (1) are held in through holding holes (3) in a holding plate (2). A selected one of the electronic components (1) is positioned just above a mounting position on the substrate (10) and a pushing pin (23 or 24 or 26) is positioned just above that electronic component (1). Then, the pushing pin (23 or 24 or 26) lowers and pushes the selected electronic component (1) down out of its holding hole (3) to mount it directly onto the substrate (10).

8 Claims, 11 Drawing Sheets

FIG. 27 (A) (Prior Art)
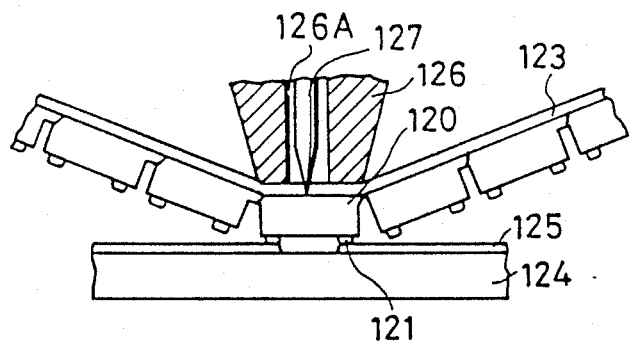
FIG. 27 (B) (Prior Art)
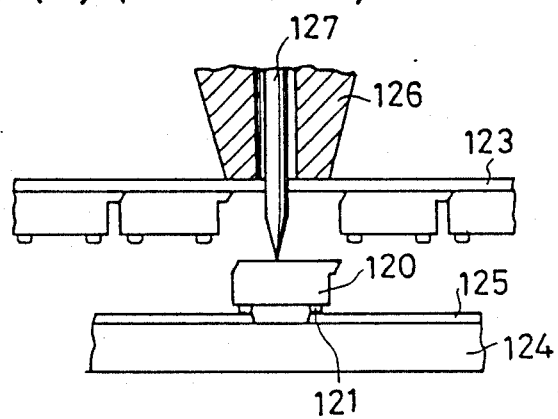
FIG. 27 (C) (Prior Art)
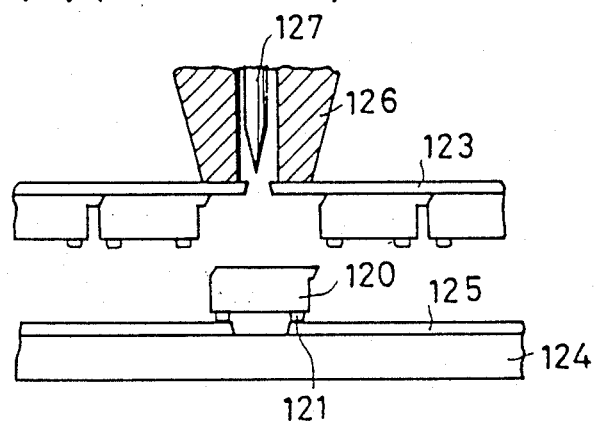

METHOD AND APPARATUS FOR MOUNTING ELECTRONIC COMPONENTS

FIELD OF THE INVENTION AND RELATED ART STATEMENT

1. Field of the Invention

The present invention relates to a method and apparatus for mounting electronic components onto a substrate, etc.

2. Description of the Related Art

A well-known example of the conventional apparatus for mounting electronic components is shown in FIG. 25. In the figure, electronic components pack 50 comprises lined-up electronic components holders 52 and electronic components 51 which are stored in spaces 53 between two adjacent holders 52, both holders and spaced being covered by a protective tape 54. By moving the pack 50 intermittently in the direction shown by the arrow 59 and stripping off the tape 54 by a roller 60 the components 51 are exposed. Then, a suction nozzle 55 is lowered to suck up a component 51 and is raised to take them out one by one. After that, the electronic components 51 are transferred onto a substrate (not shown). Besides, an electronic components pack which has an adhesive tape instead of the catching spaces 53 is also known. Further, an electronic components pack wherein scattered electronic components (not shown) are put on a tray (not shown) and taken out by a suction nozzle 55 is also known. Furthermore, an apparatus for mounting electronic components as shown in FIG. 26 is also known. In that apparatus electronic components 51 are put on a holding sheet 56 which is mounted on a movable frame 57 and has elasticity and adhesiveness, and when a selected electronic component 51 is positioned just under a suction nozzle 55, the holding sheet 56 is pushed upward by the pushing pins 58, and thereby the selected electronic component 51 is detached from the holding sheet 56 and is sucked up by the suction nozzle 55 and transferred elsewhere.

On the other hand, the Japanese examined published patent application No. Sho 61-30737 shows a method for mounting electronic components wherein electronic components 120 having bump electrodes 121 are fixed on the conductive lands 125 a printed circuit substrate 124 by inter-metallic bonding, as shown in FIG. 27(A), FIG. 27(B), and FIG. 27(C). The method includes the steps of holding the electronic components 120 on an adhesive sheet 123, contacting a selected bump electrode 121 with the conductive lands 125 of the printed circuit substrate 124 by lowering a tool 126 having a bore 126A, pressing the selected electronic component 120 against the conductive lands 125 by a pin 127 projectable through the bore to penetrate the adhesive sheet 123, peeling the selected component from the adhesive sheet by raising the tool 126 and the adhesive sheet, separating the selected electronic from the adhesive sheet 123 without separation from the lands 125 by raising the pin 127 from the selected component 120, and inter-metallically connecting the bump electrodes 121 of the selected component 120 and the conductive lands 125 by contacting a bonding tool (not shown).

However, the above-mentioned apparatus for mounting electronic components shown in FIG. 25 and FIG. 26 requires many steps for mounting the components onto a substrate by a suction nozzle 55, namely, the sucking step, the transferring step and the mounting step. Therefore, the mounting operation is inefficient especially when the electronic components are very small, the suction nozzle 55 is likely to fail to suck up a component.

On the other hand, in the method shown in FIGS. 27A-C, there are few steps since the electronic components are directly mounted from the sheet 123 onto the printed circuit substrate 124, and there is no possibility of suction nozzle failure. However, the method is used only for mounting by inter-metallic bonding. And also, if the adhesive sheet 123 expands, shrinks or is broken by the pin 127 at the time of mounting, the other unselected components are not held stably. Thus, accuracy of positioning is impaired.

OBJECT AND SUMMARY OF THE INVENTION

The object of the present invention is to provide an improved method and apparatus for mounting the components wherein electronic components are held stably, number of steps for mounting electronic components is small, and malfunctions are minimized.

In order to achieve the above-mentioned object, an apparatus for mounting electronic components in accordance with the present invention comprises:

a substantially horizontal table for supporting a substrate whereon electronic components are to be mounted, holding means disposed above the table for holding a holding plate which has plural holding holes for electronic components, pushing means disposed above the holding plate which can to be raised and lowered to push a selected one of the components out its holding hole onto the substrate, and moving means for moving at least two of the table, the holding means and the pushing means in two horizontal directions, to position a selected component above a selected position on the substrate with the pushing means positioned above the selected component.

By adopting the above-mentioned construction, the following advantages are presented.

(1) Electronic components are mounted onto the substrate by only a few steps.

(2) Electronic components are mounted precisely and without malfunctioning.

BRIEF DESCRIPTION OF THE DRAWING

FIG. 27(A), FIG. 27(B) and FIG. 27(C) are fragmentary cross-sectional views showing still another known method for mounting electronic components disclosed in Japanese examined published patent application No. Sho 61-30737.

DESCRIPTION OF THE PREFERRED EMBODIMENT

Figure 2:
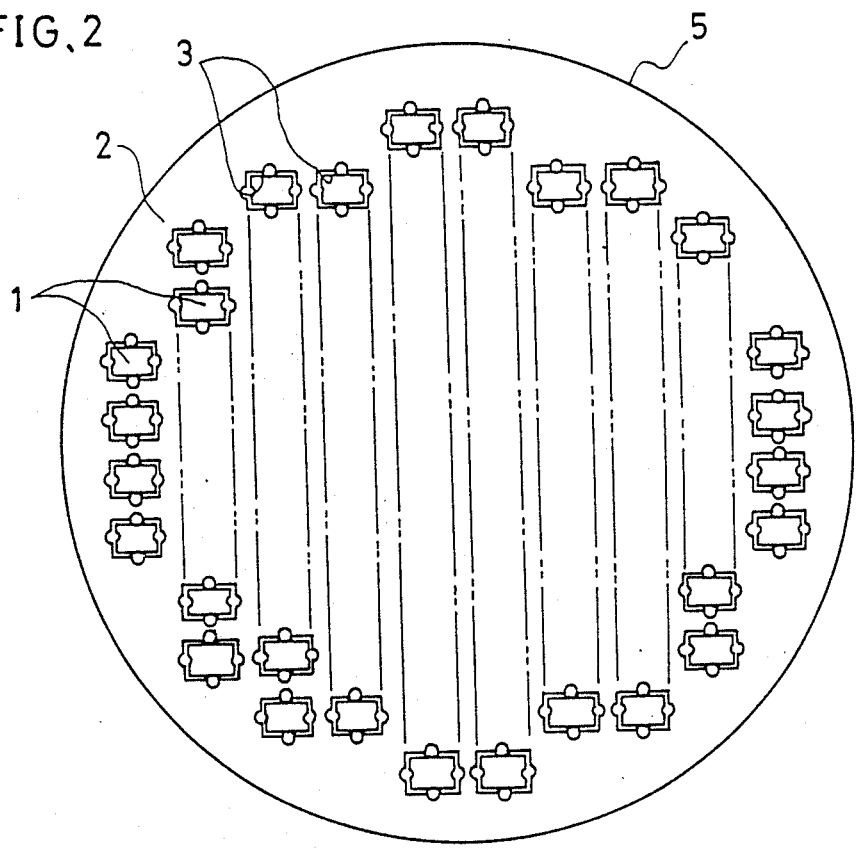
FIG. 2 is a plan view showing an electronic components pack of an embodiment in accordance with the present invention.
Figure 3:
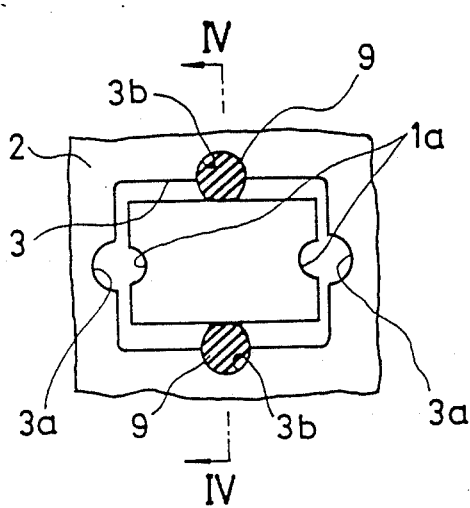
FIG. 3 is an enlarged plan view of one of the electronic components shown in FIG. 2.
Figure 4:
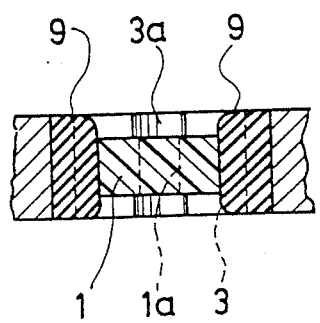
FIG. 4 is a cross-sectional view taken on line IV—IV in FIG. 3.

Hereafter, a preferred embodiment of the present invention is described with reference to the accompanying drawings. FIG. 2 shows a plan view of an electronic components pack 5. The electronic components pack 5 has rectangular holding holes 3 which are formed in rows by punching through a holding plate 2 made of a hard material, such as stainless steel. FIG. 3 shows an enlarged plan view one of the holding holes 3, and FIG. 4 shows a cross-sectional view taken on line IV—IV of FIG. 3. A pair of semicylindrical concaves 3b are formed in opposite sides of the holding hole 3, and therein cylindrical elastic elements 9 are fixed with about half thereof projecting out of the concave. When an electronic component 1 is inserted into the holding hole 3, the elastic elements 9 are compressed, and thereby the electronic component 1 is held stably. Thus the electronic components pack 5 is constructed by holding electronic parts 1 in each holding hole 3 of the holding plate 2. Further, semicylindrical concaves 3a and 1a are formed opposite to each other in the other sides of the holding holes 3 and the electronic components 1, respectively.

Figure 1:
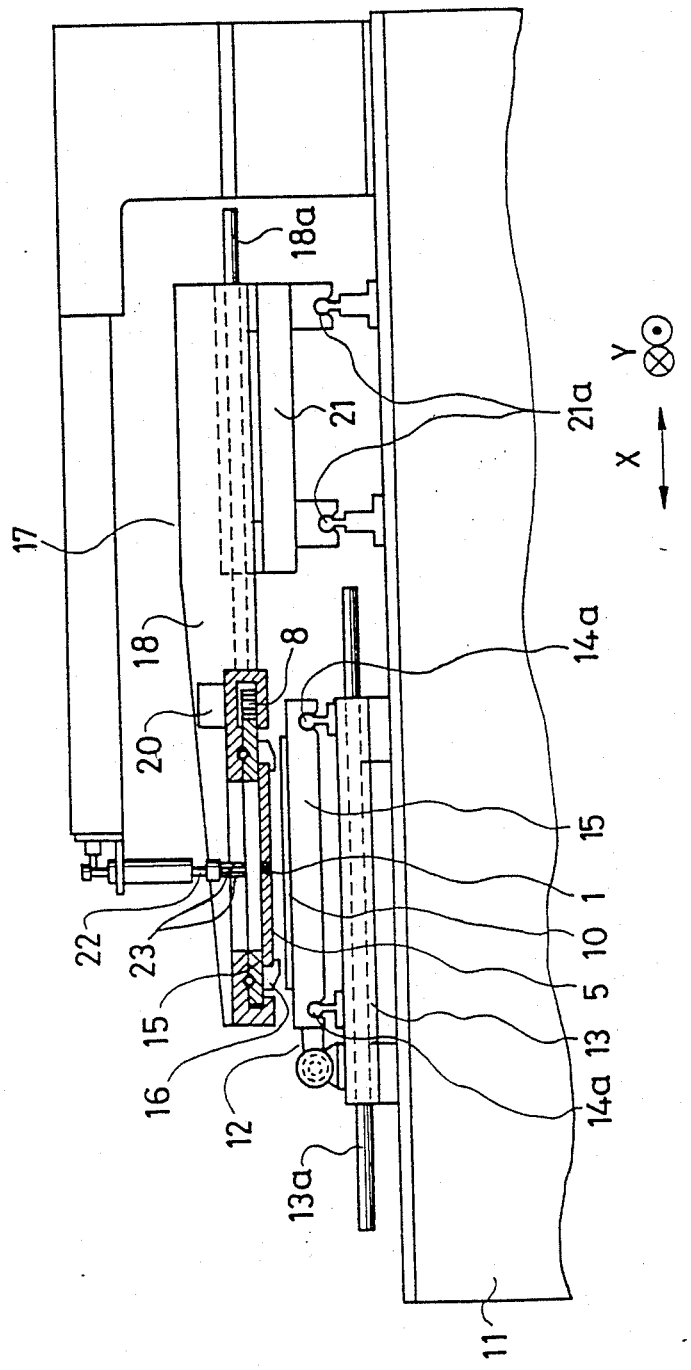
FIG. 1 is a side view, partly in section, showing an embodiment of an apparatus for mounting electronic components in accordance with the present invention.
Figure 5:
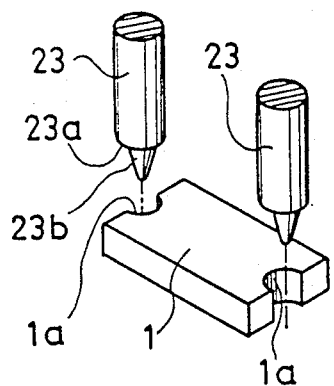
FIG. 5 is an enlarged perspective view showing the pushing pins and a selected electronic component shown in FIG. 1.
Figure 6:
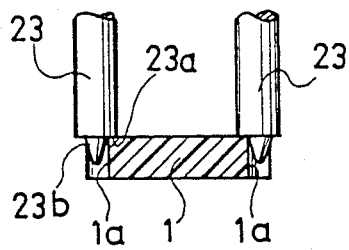
FIG. 6 is a cross-sectional view of FIG. 5.

Next, a construction of the apparatus for mounting electronic components will be described referring to FIG. 1 showing a side view thereof. Table 12, being capable of moving and positioning in X and Y horizontal directions, which are perpendicular each other, is disposed on the base 11. A substrate 10 whereon the electronic components 1 are to be mounted is put on the table 12. The table 12 comprises a table 13 which is slidable along X-direction rods 13a secured on the base 11 and a Y table 14 which is slidable along Y-direction rods 14a secured on the table 13. A circular frame 15 for holding an electronic components pack 5 by a holding grip 16 is movable in a horizontal direction and rotatable around a center thereof. A holding frame 17 is mounted beside table 12, and a holding arm 18 of the holding frame 17 extends above the table 12. The circular frame 15 is held rotatably at an end of the holding arm 18, and gear teeth (not shown) on the periphery of the circular frame 15, mesh with a pinion 8 which is rotated by a driving motor 20. The holding frame 17 comprises a slider 21 which is movable along Y-direction rods 21a mounted on the base 11 and the holding arm 18 which is movable along X-direction rods 18a secured on the Y-direction slider 21. A pushing shaft 22, which is capable of rotating around its own axis and raising/lowering above the X-Y table 12 around an axis thereof, is mounted above the circular frame 15. A pair of pushing pins 23 project from the lower end of the pushing shaft 22. Referring to FIGS. 5 and 6, the pushing pins 23 have a downward facing peripheral shoulder offset part 23a at their lower end for engaging with and pushing the upper surface of an electronic component 1 and a tapered part 23b for positioning by engaging with the semicylindrical concaves 1a in the electronic component 1.

Next, the mounting procedure for the electronic component 1 will be described with reference to FIG. 1. Firstly, table 12 whereon the substrate 10 is fixed moves to position the location where an electronic component 1 is to be mounted under the center of the pushing shaft 22. Next, an adhesive agent painting apparatus (not shown) paints the adhesive agent or a soldering paste on the substrate in the location where the electronic component 1 is to be mounted. Next, the holding frame 17 is driven to move the circular frame 15 to position the electronic component 1, which is selected to be mounted from among many electronic components 1 held in the electronic components pack 5, just under the pushing shaft 22, so that the center of the selected electronic component coincides with the vertical axis of the pushing shaft 22. At the same time, mounting angle of the selected electronic component 1 is determined by rotating the circular frame 15. Further, the pushing shaft 22 rotates in order to coincide with the angle of the selected electronic part 1. Then, the pushing shaft 22 lowers and the pushing pins 23 push the electronic component 1 out of the holding hole 3, and directly onto the substrate 10. At that time, as shown in FIG. 5 and FIG. 6, the tapered part 23b of the pushing pins 23 touch the semicylindrical concaves 1a of the electronic component 1 so as to guide it into a correct position and the shoulder 23a push the electronic component 1 out of the holding hole 3. Therefore, the electronic component 1 can be positioned correctly and mounted simultaneously onto the substrate 10.

If there is considerable distance between the substrate 10 and the holding plate 2, a suction nozzle (not shown) for retaining the electronic component 1 may be provided on the pushing shaft 22.

Figure 7:
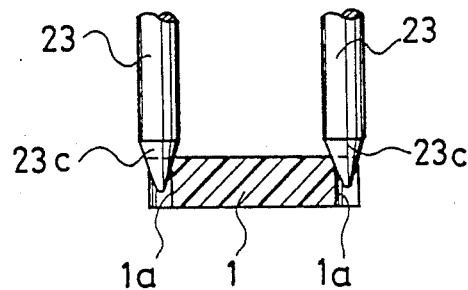
FIG. 7 is a cross-sectional view like FIG. 6 but showing modified pushing pins.

In the above-mentioned embodiment, the pushing pins 23 have the shoulder 23a and the tapered part 23b for pushing and positioning the electronic component 1, respectively. But, as shown in FIG. 7, a pushing pin 23 having no shoulder but only a long tapered part 23c for both pushing and positioning is equally usable.

Figure 8:
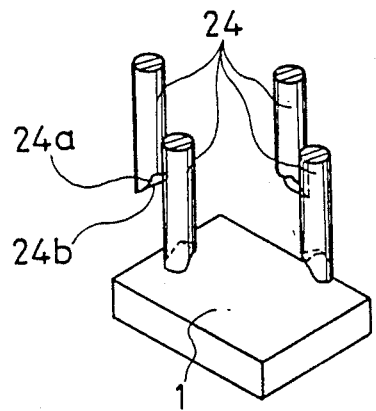
FIG. 8 is a perspective view corresponding to FIG. 5 but showing a further modification pushing pins for a different electronic component.
Figure 9:
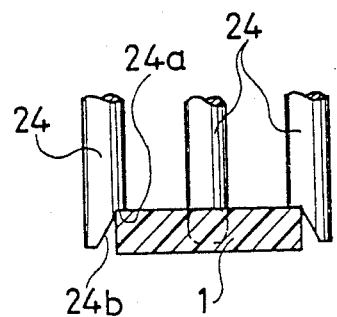
FIG. 9 is a cross-sectional view of FIG. 8.
Figures 10, 11:
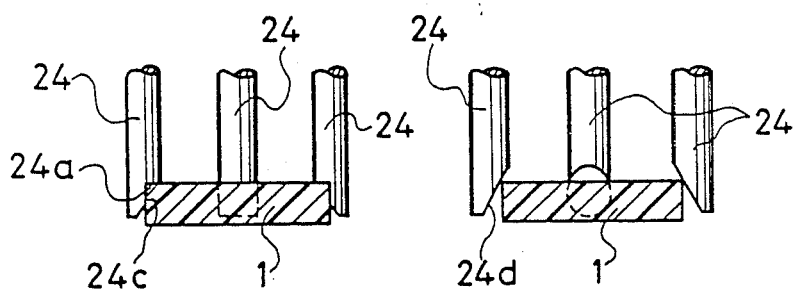
FIG. 10 and FIG. 11 are cross-sectional views corresponding to FIG. 9 showing further modifications of the pushing pins 24.

Next, a second embodiment of the present invention will be described with reference to FIGS. 8 and 9. In this embodiment, the electronic component 1 has no concaves (such as 1a in FIG. 5), and the pushing shaft 22 (FIG. 1) has four pushing pins 24 each having a downward facing arc-like shoulder 24a for engaging and pushing four edges of the upper surface of the electronic component 1 and an inclined generally planar surface 24b for positioning the electronic component 1. When the pushing shaft 22 (FIG. 1) is lowered, the pushing pins 24 push the electronic component 1 out of the holding hole 3 and position the same into a correct position to be mounted on the substrate 10. In this embodiment, some varieties of the pushing pin 24 are equally usable as shown in FIGS. 10 and 11. That is, the pushing pins 24 of FIG. 10 have a planar surface 24c, which is perpendicular to the shoulder 24a instead of an inclined surface (such as 24b in FIG. 8). The pushing pins 24 shown in FIG. 11 have only a single inclined generally planar surface 24d for both pushing and positioning the electronic component 1.

Figure 12:
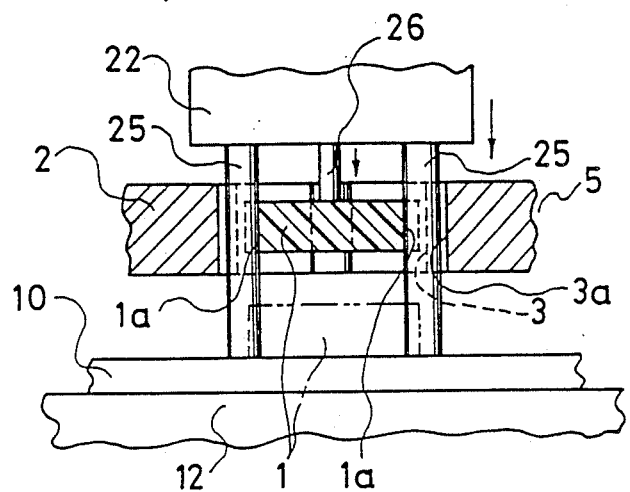
FIG. 12 is an enlarged fragmentary cross-sectional view showing the mounting operation of another embodiment in accordance with the present invention.
Figure 13:
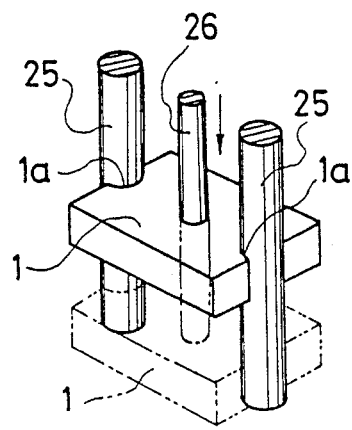
FIG. 13 is a perspective view showing the guide pins, the pushing pin and the electronic component shown in FIG. 12.

Next, a third embodiment of the present invention will be described with reference to FIGS. 12 and 13. In this embodiment, the pushing shaft 22 has guide pins 25, which engage with the semicylindrical concaves 1a thus formed in the electronic component 0 and guide it slidingly from the holding hole 3 to the substrate 10 thereby to mount correctly on the substrate 10, and a pushing pin 26 projectable out of the shaft for pushing the electronic component out of the holding hole 3. When the pushing shaft 22 is lowered, the guide pins 25 penetrate the holes defined between the concaves 3a of the holding hole 3 and the concaves 1a of the electronic component 1 until both ends of the guide pins touch the substrate 10. Thereafter, the pushing pin 26 is projected out of the pushing shaft 22 to push the electronic component 1 out of the holding hole 3 and is mounted correctly onto the substrate 10 by being supported and guided by the guide pins 25.

Figure 14:
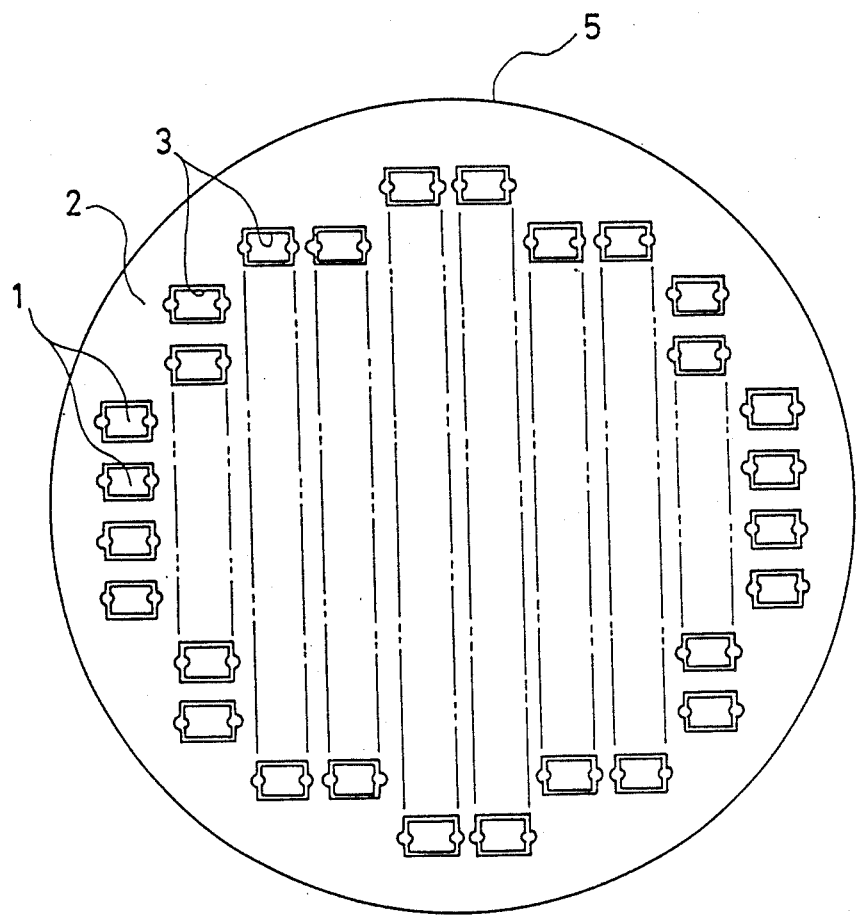
FIG. 14(a) is a plan view showing an electronic components pack of another embodiment in accordance with the present invention.
FIG. 14(b) is a side view of the pack shown in FIG. 14(a).
Figure 14:
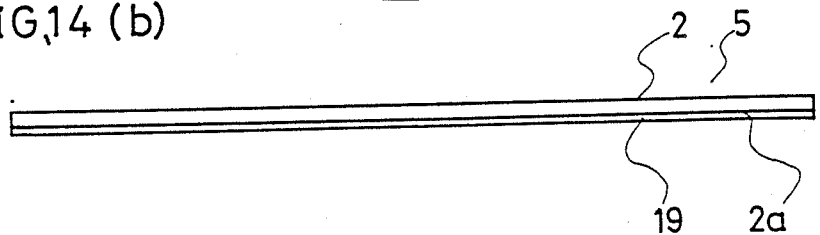
Figure 15:
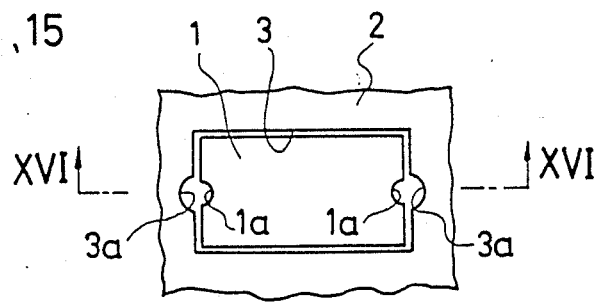
FIG. 15 is an enlarged plan view of one of the electronic components shown in FIG. 14(a).
Figure 16:
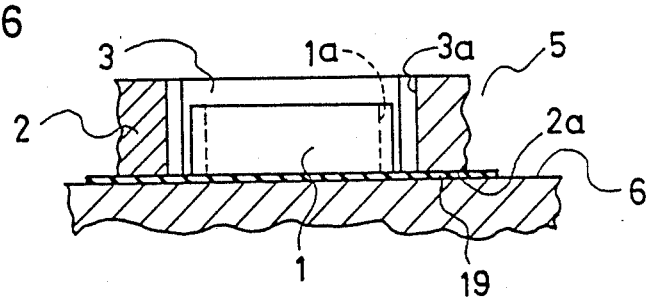
FIG. 16 is a cross-sectional view taken on line XVI—XVI of FIG. 15.

Next, a fourth embodiment of the present invention will be described with reference to FIG. 14(a) and FIG. 14(b). This embodiment is characterized in that an adhesive sheet 19 is bonded to one side 2a of the holding plate 2 for holding the electronic components 1 instead of the elastic elements 9 and in the foregoing embodiments. Referring to FIG. 15 and FIG. 16, semicylindrical concaves 3a and 1a are formed opposite to each other in the holding plate 2 and the electronic component 1, respectively, the same as in FIG. 3. The adhesive sheet 19 is bonded to the lower surface 2a of the holding plate 2 to cover the lower ends of the holes 3, and they (2 and 19) are put on a table 6 with the adhesive sheet lowermost. The electronic components 1 are then inserted into each holding hole 3 to construct the electronic component pack 5.

Figure 17A:
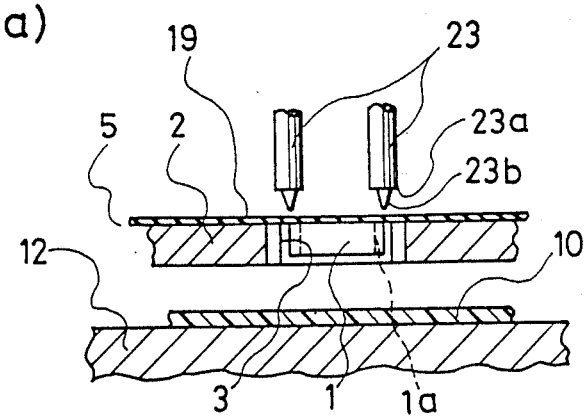
FIG. 17(a) and FIG. 17(b) are cross-sectional views showing the mounting operation for the electronic components shown in FIG. 16.
Figure 17B:
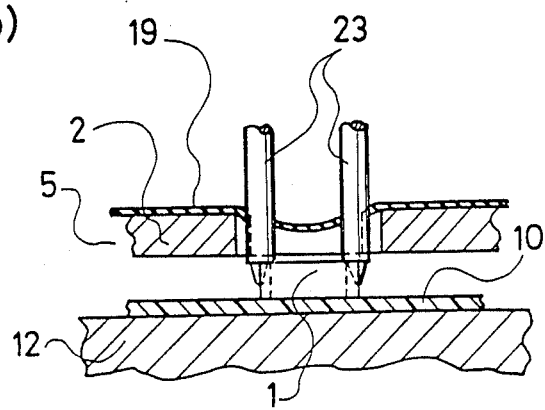

Next, the mounting procedure of the electronic components 1 from the so constructed pack will be described with reference to FIGS. 17(a) and 17(b). As shown in FIG. 17(a), the pack 5 is held on the frame 15 with the sheet 19 on top the pushing pins 23 have the shoulder 23a and the tapered parts 23b the same as in FIG. 5. When the pushing shaft 22 (FIG. 1) lowers, the pushing pins 23 break through the adhesive sheet 19 and push the electronic component 1 out of the holding hole 3, to mount the electronic component 1 mounted directly mounted onto the substrate 10 as shown in FIG. 17(b). At that time, the shoulder 23a of the pins 23 push the electronic component out of the holding hole 3 against the adhesive strength of the adhesive sheet 4, and the tapered parts 23b engage the semicylindrical concave 1a in the electronic component 1, and thereby the electronic component 1 can be positioned accurately and mounted simultaneously onto the substrate 10. If the substrate 10 is far below the holding plate 2, a suction nozzle (not shown) for holding the electronic component 1 or a guide pin (not shown) for guiding the electronic component down by slidingly engaging with the semi-cylindrical concave 1a may be provided on the pushing shaft 22 (FIG. 1).

Figure 18:
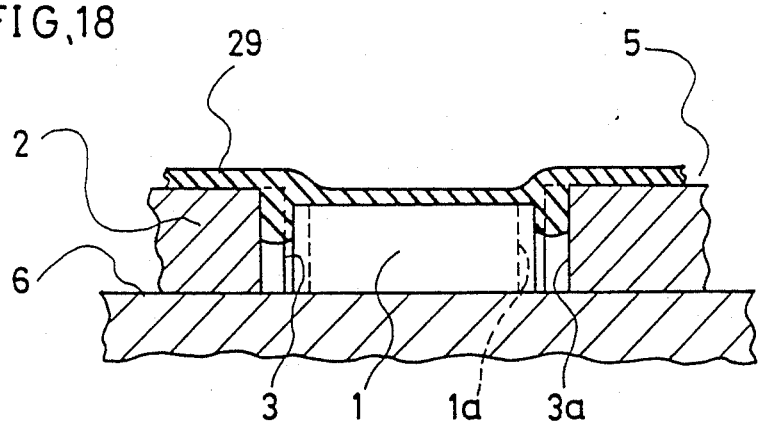
FIG. 18, FIG. 19(a) and FIG. 19(b) are cross-sectional view showing a mounting operation using an adhesive agent in place of the adhesive sheet shown in FIGS. 16, 17(a) and 17(b).
Figure 19A:
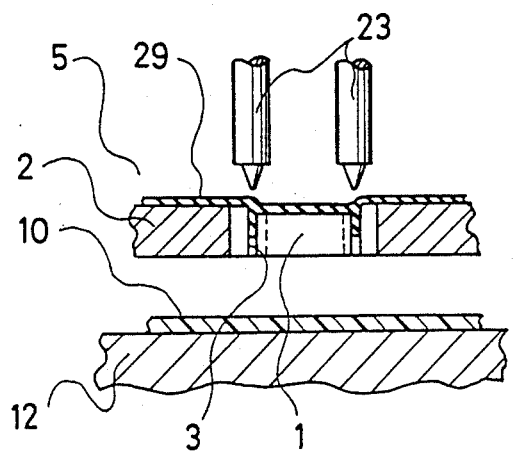
Figure 19B:
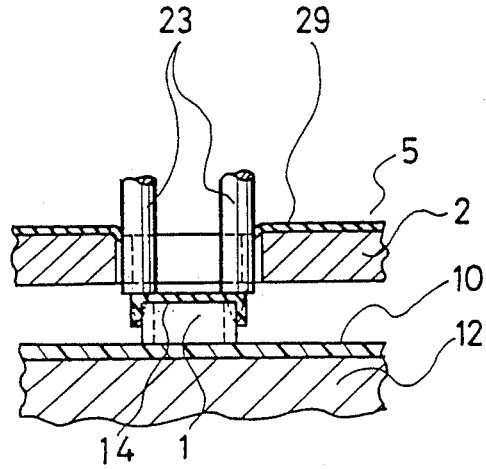
Figure 20:
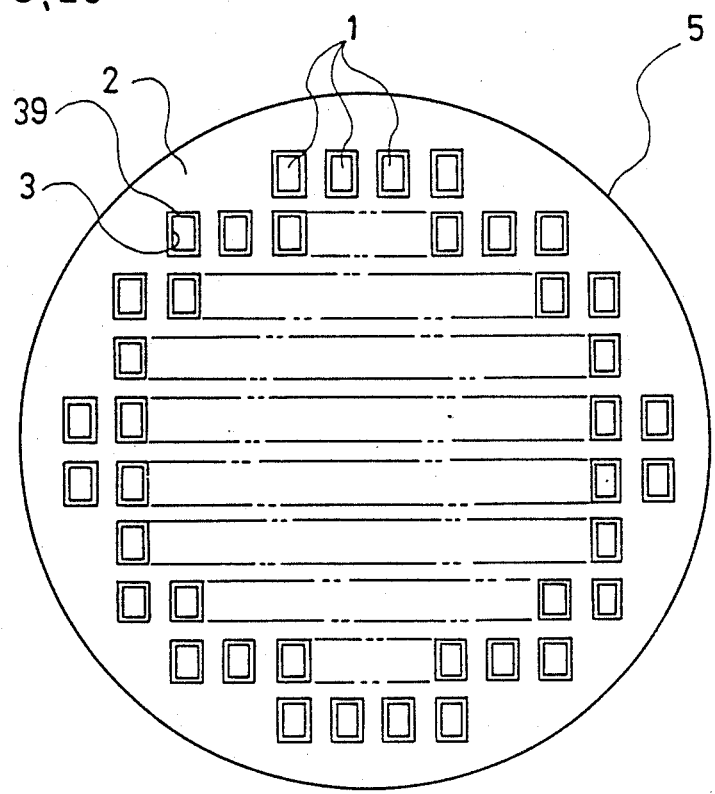
FIG. 20 is a plan view showing an electronic components pack of another embodiment in accordance with the present invention.

Next, a fifth embodiment of the present invention will be described with reference to FIGS. 18, 19(a) and 19(b). The difference between this embodiment and that of FIGS. 14(a)-17(b) is that of layer 29 of an adhesive agent is used for holding the electronic component 1 instead of the adhesive sheet 19 of FIGS. 14(b)-17(a). In FIG. 18, the holding plate 2, wherein the holding holes 3 are formed is put on the table 6, and the electronic components 1 are inserted into each holding hole 3 so that their mounting surfaces facing the table 6. After that, the adhesive agent is painted on almost all of the area of the upper surface of the holding plate 2, thereby to form the layer 29 of the adhesive agent. After drying, the layer 29 holds the electronic components 1, to thus construct the electronic components pack 5. For mounting these electronic components 1 onto the substrate 10, the electronic components pack 5 is held opposite the substrate 10 with the layer 29 on top 10. Similar to the foregoing embodiment, when the pushing shaft 22 (FIG. 1) lowers, the pushing pins 23 break through the layer 29 and push the electronic component 1 out of the holding hole 3 down onto the substrate 10 as shown in FIGS. 19(a) and 19(b). Furthermore, this embodiment offers the advantage that the upper surface of the component 1, opposite to substrate 10 after completion of mounting, is protected by a separated portion of the layer 29.

Figure 21:
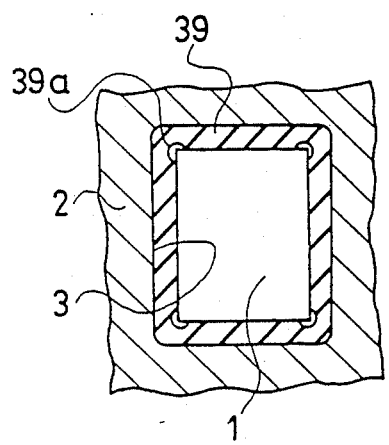
FIG. 21 is an enlarged plan view of one of the electronic components FIG. 20.
Figure 22:
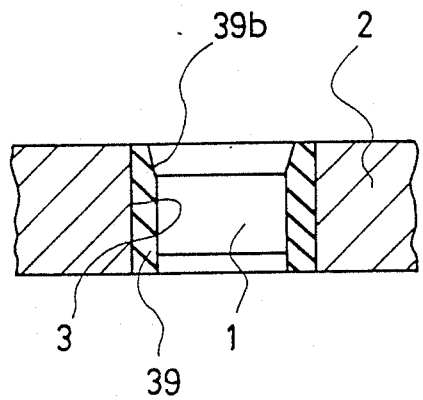
FIG. 22 is a cross-sectional view of FIG. 21.
Figure 23:
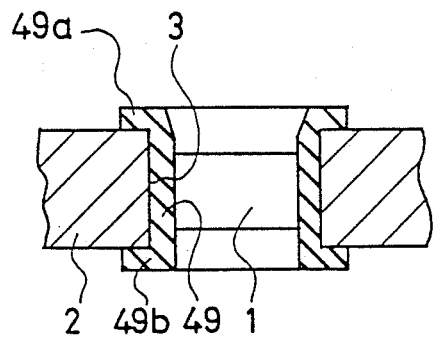
FIG. 23 is a cross-sectional view corresponding to FIG. 22 but showing adhesive elastic element.
Figure 24:
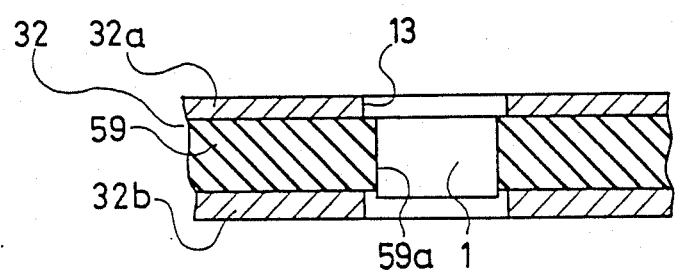
FIG. 24 is a cross-sectional view corresponding to FIG. 22 but showing a different holding plate and a different elastic element.
Figure 25:
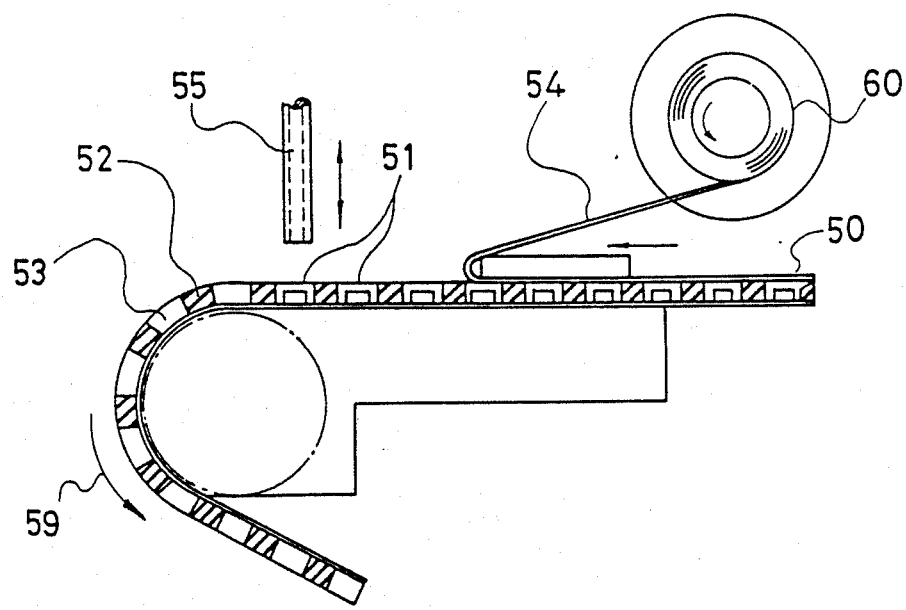
FIG. 25 is a fragmentary cross-sectional view of a conventional apparatus for mounting electronic components.
Figure 26:
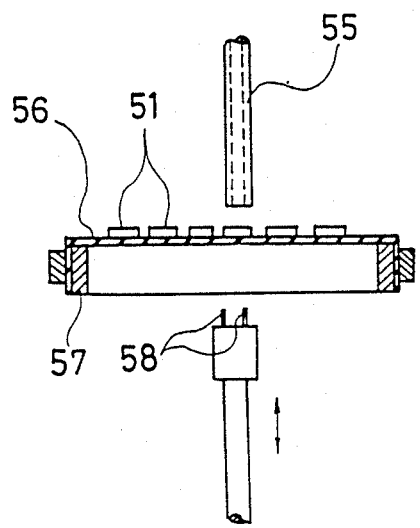
FIG. 26 is a fragmentary cross-sectional view showing another conventional apparatus for mounting electronic components.

Next, a sixth embodiment of the present invention will be described with reference to FIG. 21 and FIG. 22. This embodiment is characterized in that a rubber lining 39 is provided on the surfaces of the holding hole 3 instead of using the semicylindrical elastic element 9 (FIG. 3) or the adhesive sheet 19 (FIG. 16). In FIG. 21, the rubber lining 39 having suitable thickness is bonded to the surfaces of the holding hole 3, and thereby a tubular elastic element 39 is formed for holding an electronic component 1. The aperture or hole through the elastic element 39 is generally complementary to but slightly smaller than an electronic component in order to be compressed by insertion of an electronic component 1 to hold the latter stably. Further, cutouts 39a are formed in the four corners of the elastic element 39 in order to enable an electronic component 1 to be inserted smoothly. Also in the upper end of the elastic element 39 is interiorly chamfered, as at 39b to facilitate insertion of a component. Thus, the electronic components pack 5 is constructed. In this embodiment, some varieties of the elastic element 39 are equivalently applicable as shown in FIGS. 23 and 24. In FIG. 23, the elastic element 49 has end flanges 49a and 49b which engage with upper and lower surfaces of the holding plate 2. In FIG. 24, a holding plate 32 comprises an elastic layer 59 sandwiched between a pair of hard material layers 32a and 32b both bonded to the elastic layer. The elastic layer 59 projects slightly into the holding hole 13 formed by the hard material layers 32a and 32b for holding the electronic component 1.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. Method for mounting generally flat and rectangular electronic components on a substrate comprising the steps of:
    releasably holding electronic components in through holding holes in a holding plate, said components being held in a generally horizontal orientation,
    positioning said holding plate above and generally parallel to a substrate,
    moving one of said plate and substrate to align a selected one of the electronic components with the position on said substrate where the selected component is to be mounted,
    pushing said selected electronic component downward out of its holding hole and guiding it onto the mounting position on the substrate while maintaining said component in said horizontal orientation, and
    securing the selected component on the substrate.

2. The method defined in claim 1 wherein the holding step is performed with an elastic element interposed between at least two opposite sides of each element and the corresponding sides of the corresponding hole.

3. The method defined in claim 1 wherein the holding step is performed by an adhesive on the upper surface of the holding plate and engaging each component.

4. An apparatus for mounting generally flat and rectangular electronic components on a substrate comprising:
    a substantialy horizontal table for holding a substrate whereon electronic components are to be mounted,
    means disposed above said table for holding generally horizontally an electronics pack comprising a holding plate having plural through holes each releasably holding an electronic component,
    pushing and guiding means disposed above said pack for engaging a selected one of said components centrally along at least two opposite side edges thereof,
    means for raising and lowering said pushing and guiding means to push a selected one of said components out of the hole in which it is held while guiding it down horizontally onto a predetermined position on said substrate, and
    means for moving at least two of said table, said holding means and said pushing means in two horizontal directions at right angles to each other to vertically align said selected electronic component and said pushing means with said predetermined position.

5. The apparatus defined in claim 4 wherein the pushing and guiding means includes pushing surfaces engageable with the upper surface of the component and guiding surfaces engageable with the side edges of the component.

6. The apparatus defined in claim 4 wherein the guiding and pushing means comprises a pushing member engageable with the upper surface of the component and at least two guiding members engageable with the side edges of the component.

7. The apparatus defined in claim 4 including elastic means interposed between each component and the sides of the corresponding hole for releasably holding the component therein.

8. The apparatus defined in claim 4 including adhesive means on the upper surface of the holding plate and engaging each component for releasably holding each component in its corresponding hole.

* * * * *